United States Patent
Chang (10) Patent No.: US 9,261,786 B2
(45) Date of Patent: Feb. 16, 2016

(54) PHOTOSENSITIVE MATERIAL AND METHOD OF PHOTOLITHOGRAPHY

(75) Inventor: Ching-Yu Chang, Yuansun Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 222 days.

(21) Appl. No.: 13/437,674

(22) Filed: Apr. 2, 2012

(65) Prior Publication Data

US 2013/0260311 A1  Oct. 3, 2013

(51) Int. Cl.
*G03F 7/00*  (2006.01)
*G03F 7/039*  (2006.01)
*G03F 7/20*  (2006.01)
*G03F 7/26*  (2006.01)
*G03F 7/32*  (2006.01)

(52) U.S. Cl.
CPC ............ *G03F 7/0397* (2013.01); *G03F 7/2041* (2013.01); *G03F 7/26* (2013.01); *G03F 7/325* (2013.01)

(58) Field of Classification Search
CPC ...... H01L 21/0273; G03F 7/2022; G03F 7/38
USPC .......................................... 430/330, 325, 436
See application file for complete search history.

(56) References Cited

U.S. PATENT DOCUMENTS

| | | |
|---|---|---|
| 6,183,872 B1 | 2/2001 | Tanaka et al. |
| 6,420,085 B1 | 7/2002 | Nishi et al. |
| 6,548,221 B2 | 4/2003 | Uetani et al. |
| 6,902,862 B2 | 6/2005 | Takahashi et al. |
| 7,285,369 B2 | 10/2007 | Takahashi |
| 7,629,108 B2 | 12/2009 | Watanabe et al. |
| 7,651,831 B2 | 1/2010 | Li et al. |
| 7,670,751 B2 | 3/2010 | Ohashi et al. |
| 7,972,763 B2 | 7/2011 | Suetsugu et al. |
| 7,985,534 B2 | 7/2011 | Tsubaki |
| 8,017,304 B2 | 9/2011 | Tarutani et al. |
| 8,383,318 B2 | 2/2013 | Meador et al. |
| 8,394,570 B2 | 3/2013 | Ohashi et al. |
| 8,420,304 B2 | 4/2013 | Inatomi |
| 8,609,889 B2 | 12/2013 | Ohashi et al. |
| 8,642,253 B2 | 2/2014 | Tsubaki |
| 8,741,554 B2 | 6/2014 | Hatakeyama et al. |
| 8,883,407 B2 | 11/2014 | Amara et al. |
| 2005/0069819 A1 | 3/2005 | Shiobara |
| 2007/0059849 A1 | 3/2007 | Op de Beeck |
| 2007/0092843 A1 | 4/2007 | Yang |
| 2008/0153036 A1 | 6/2008 | Suetsugu et al. |
| 2008/0233514 A1* | 9/2008 | Li et al. ...................... 430/270.1 |
| 2009/0098490 A1 | 4/2009 | Pham et al. |
| 2009/0133908 A1 | 5/2009 | Goodner et al. |
| 2010/0143830 A1 | 6/2010 | Ohashi et al. |
| 2010/0167178 A1* | 7/2010 | Yamato et al. ..................... 430/2 |
| 2010/0213580 A1 | 8/2010 | Meador et al. |
| 2010/0304297 A1 | 12/2010 | Hatakeyama et al. |
| 2011/0003247 A1 | 1/2011 | Ohashi et al. |
| 2011/0003250 A1 | 1/2011 | Amara et al. |
| 2011/0045413 A1 | 2/2011 | Tsubaki |
| 2011/0070542 A1 | 3/2011 | Wang et al. |
| 2013/0260311 A1 | 10/2013 | Chang |
| 2013/0323641 A1 | 12/2013 | Chang et al. |

FOREIGN PATENT DOCUMENTS

| | | |
|---|---|---|
| EP | 0361906 | 4/1990 |
| JP | 09-054440 | 2/1997 |
| JP | 2001-147523 | 5/2001 |
| JP | 2002-139838 | 5/2002 |
| JP | 2006-251672 | 9/2006 |
| WO | WO-2011-111805 | 9/2011 |

OTHER PUBLICATIONS

Ching-Yu Chang; "Photosensitive Material and Method of Lithography;" U.S. Appl. No. 13/486,697, filed Jun. 1, 2012; 30 pages.

Hiroto Yukawa; "TOK Resist Development Status for EUVL;" May 23, 2006; pp. 1-11; C/N: 1220605080; TOK Litho Forum; Tokyo Ohka Kogyo Co., Ltd.; Advanced Material Development Division 1; Vancouver, Canada.

* cited by examiner

*Primary Examiner* — Daborah Chacko Davis (74) *Attorney, Agent, or Firm* — Haynes and Boone, LLP (57) ABSTRACT

Methods and materials directed to solubility of photosensitive material in negative tone developer are described. The photosensitive material may include greater than 50% acid labile groups as branches to a polymer chain. In another embodiment, a photosensitive material, after exposure or irradiation, is treated. Exemplary treatments include applying a base to the photosensitive material.

13 Claims, 6 Drawing Sheets

PHOTOSENSITIVE MATERIAL AND METHOD OF PHOTOLITHOGRAPHY

BACKGROUND

The semiconductor integrated circuit (IC) industry has experienced rapid growth. Technological advances in IC materials, design, and fabrication tools have produced generations of ICs where each generation has smaller and more complex circuits than the previous generation. In the course of these advances, fabrication methods and tools been developed to realize the desire for smaller feature sizes.

Lithography is a mechanism by which a pattern is projected onto a substrate, such as a semiconductor wafer, having a photosensitive layer formed thereon. The pattern may be introduced by passing radiation through a photomask. Though lithography tools have experienced significant advances in achieving the desired line width of an imaged element, further advances may be desired. For example, the photosensitive material employed may lack sufficient contrast between exposed and non-exposed areas. Thus, the fidelity of the resultant pattern may be affected.

Thus, what is desired is a method and photosensitive material that provides for contrast between the exposure and non exposure areas of a photosensitive layer.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. For example, though described herein as a photolithography method configured to fabricate semiconductor devices, any photolithography method or system may benefit from the disclosure including, for example, for TFT-LCD fabrication, and/or other photolithography processes known in the art. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
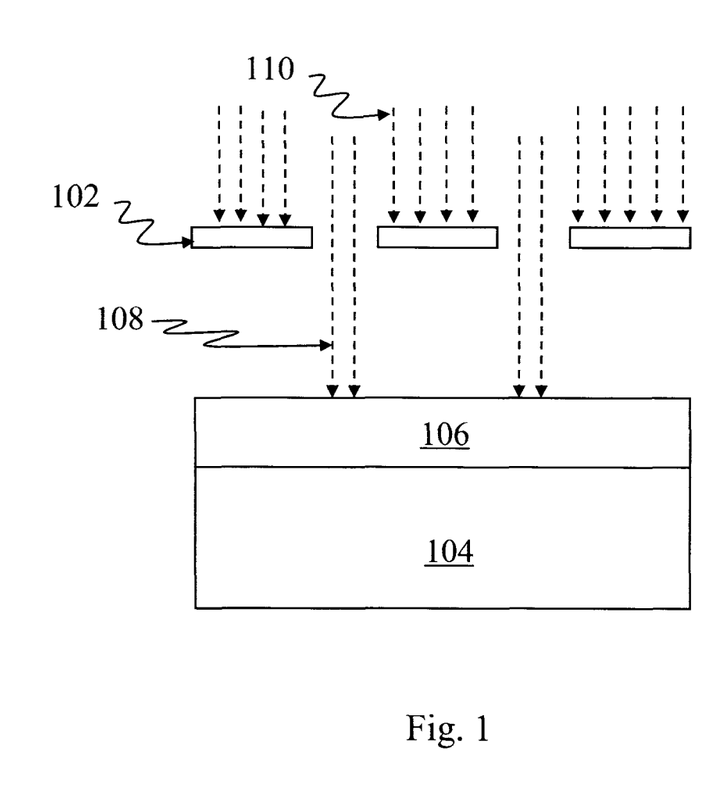
FIG. 1 is a cross-sectional view of an embodiment of irradiation (also referred to as exposure) of a substrate to a patterned radiation beam.
Figure 2:
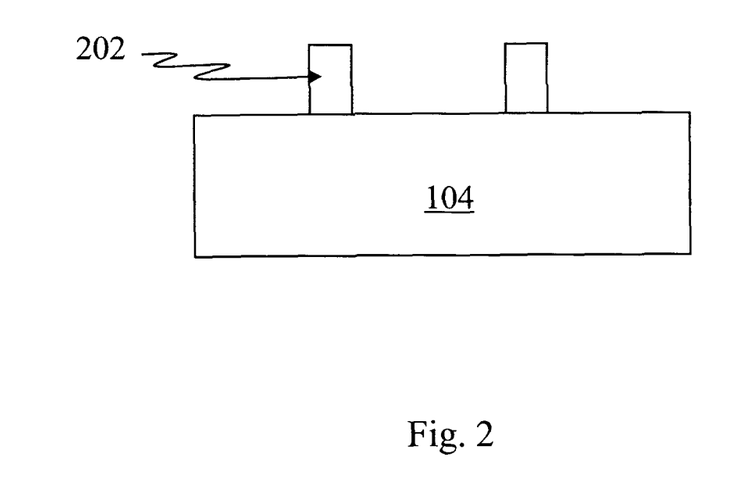
FIG. 2 is a cross-sectional view of an embodiment of the substrate after the exposure of FIG. 1.

Illustrated in FIG. 1 is an embodiment of an exposure system to subject a substrate to a patterned radiation. FIG. 2 is an embodiment of the substrate of FIG. 1 after exposure and development processes. FIG. 1 illustrates a photomask 102, a substrate 104, and a photosensitive layer 106 disposed on the substrate 104. Radiation is incident the photomask 102 and patterned by the photomask 102 providing radiation 108 incident the photosensitive layer 106 and blocked radiation 110.

Photomask 102 may be any mask type such as, a binary mask, a phase shift mask, an attenuated phase-shift mask (Att-PSM), an alternating aperture phase shift mask (Alt-PSM), a chromeless phase shift mask (CPL), and/or other possible mask types. Photomask 102 may include a substrate. The substrate may be a transparent substrate such as fused silica ($SiO_2$), or quartz, relatively free of defects, calcium fluoride, or other suitable material. Attenuating material may be disposed on the substrate; the attenuating material may include chrome or other materials such as, for example, Au, MoSi, CrN, Mo, $Nb_2O_5$, Ti, Ta, $MoO_3$, MoN, $Cr_2O_3$, TiN, ZrN, $TiO_2$, TaN, $Ta_2O_5$, NbN, $Si_3N_4$, ZrN, $Al_2O_3N$, $Al_2O_3R$, or a combination therefore. The photomask 102 may include one or more areas of etched substrate, such as provided by an HF etchant. In other embodiments, the photomask 102 is omitted and a pattern is introduced to the photosensitive layer 106 using other technologies such as electron beam or ion-beam lithography.

The substrate 104 may be a semiconductor substrate. In an embodiment, the substrate 104 is silicon in a crystalline structure. In alternative embodiments, the substrate 104 may include other elementary semiconductors such as germanium, or includes a compound semiconductor such as, silicon carbide, gallium arsenide, indium arsenide, and indium phosphide. The substrate 104 may include a silicon on insulator (SOI) substrate, be strained/stressed for performance enhancement, include epitaxially grown regions, include isolation regions, include doped regions, include one or more semiconductor devices or portions thereof, and/or include other suitable features and layers. In an embodiment, the substrate 104 is typical of a CMOS process technology. However, though processing a substrate in the form of a semiconductor wafer may be described, it is to be understood that other examples of substrates and processes may benefit from the present invention such as, for example, printed circuit board substrates, damascene processes, and thin film transistor liquid crystal display (TFT-LCD) substrates and processes.

Photosensitive layer 106 (also referred to as photoresist or resist) is disposed on the substrate 104. In an embodiment, the photosensitive layer 106 is chemical amplified photoresist (CAR). In an embodiment, the photosensitive layer 106 is a negative type resist material. The photosensitive layer 106 may include a polymer and a photoacid generator (PAG), which provides the solubility change to the developer. The photosensitive layer 106 may be formed by processes such as coating (e.g., spin-on coating) and soft baking.

The photosensitive layer 106 may include a polymer with one or more groups or chemical branches extending from (linked to) the polymer. The polymer may include any number of carbons coupled in a carbon chain. One example of a polymer that may be included in the photosensitive layer 106 is provided in FIG. 7.

In an embodiment, the groups or branches extending from a polymer of the photosensitive layer 106 may include approximately 50% or greater acid labile groups (ALG), such as ALG 400 described below with reference to FIG. 4. In an embodiment, the groups or branches extending from a polymer of a photosensitive material may include approximately 55% ALG, such as ALG 400 described below with reference to FIG. 4. In an embodiment, the groups or branches extending from a polymer of a photosensitive material may include approximately 60% ALG, such as ALG 400 described below with reference to FIG. 4. In an embodiment, the photosensitive layer 106 includes the polymer 700, described below with reference to FIG. 7.

FIG. 2 illustrates the substrate 104 and the photosensitive layer 106 after development. The photosensitive layer 106 has been patterned to provide features 202 disposed on the substrate 104. The features 202 include the portion of the photosensitive layer 106 having radiation incident the photosensitive layer 106. The features 202 are portions of the photosensitive layer 106 that are more hydrophilic and thus, more resistant to (negative tone) solvent developer. In other words, the exposed polymer of the photosensitive layer 106 is not dissolved in the negative tone developer (also referred to as a non polar solvent developer), thus providing features 202. The non-exposed area is removed by a negative tone or non polar solvent developer.

What is desired is a manner to provide a sharper contrast between the photosensitive material of the features 202 and the surrounding photosensitive material 106, as illustrated in FIG. 1. Thus, the fidelity of the pattern (e.g., features 202) may be improved.

Figure 3:
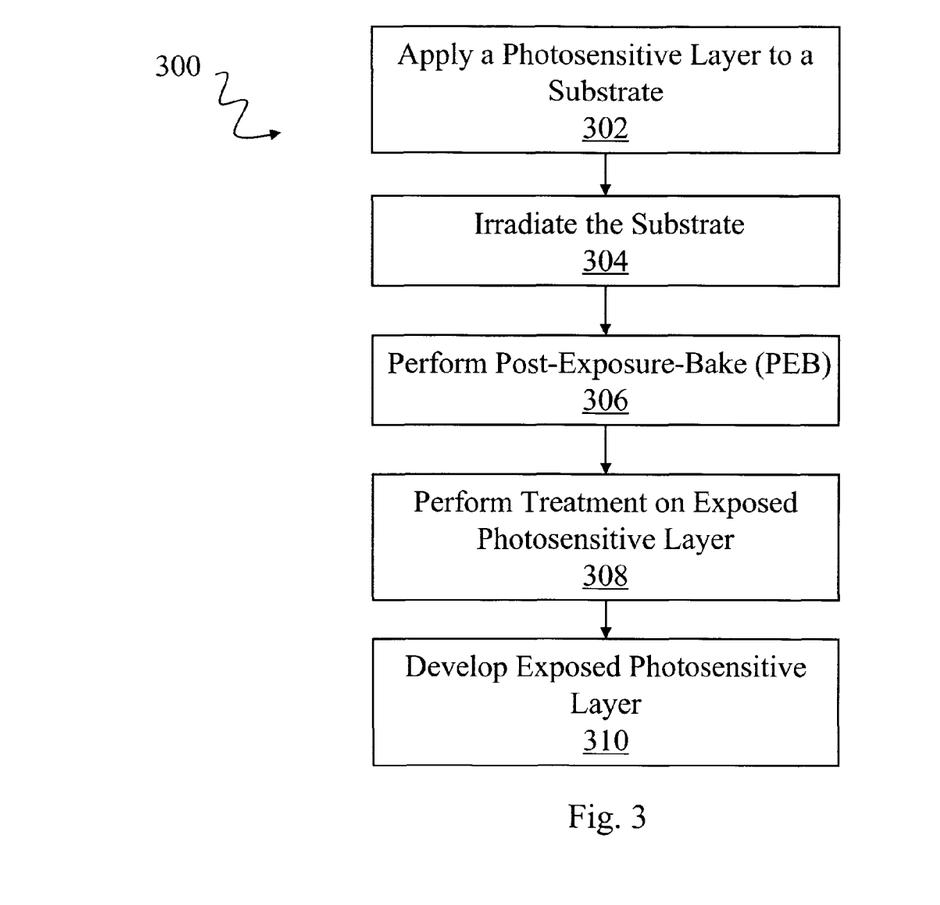
FIG. 3 is a method of patterning a layer of a substrate using one or more aspects of the present disclosure.

Referring now to FIG. 3, illustrated is an embodiment of a method of patterning a layer of a substrate. The method begins at step 302 where a photosensitive layer is formed on a substrate.

The substrate may be a semiconductor substrate used in the formation of a semiconductor device. In an embodiment, the substrate is silicon in a crystalline structure. In alternative embodiments, the substrate may include other elementary semiconductors such as germanium, or includes a compound semiconductor such as, silicon carbide, gallium arsenide, indium arsenide, and indium phosphide. The substrate may include a silicon on insulator (SOI) substrate, be strained/stressed for performance enhancement, include epitaxially grown regions, include isolation regions, include doped regions, include one or more semiconductor devices or portions thereof, and/or include other suitable features and layers. In an embodiment, the method 300 includes steps of a CMOS process technology. However, though processing a substrate in the form of a semiconductor wafer may be described, it is to be understood that other examples of substrates and processes may benefit from the present invention such as, for example, printed circuit board substrates, damascene processes, and thin film transistor liquid crystal display (TFT-LCD) substrates and processes.

Photosensitive layer (also referred to as photoresist) is disposed on the substrate using spin-on coating and/or other suitable processes. In an embodiment, a soft bake is performed after the deposition of the photosensitive layer. In an embodiment, the photosensitive layer is chemical amplified photoresist (CAR). In an embodiment, the photosensitive layer is a negative type resist material. The photosensitive layer 106 may include a polymer and a photoacid generator (PAG), which provides the solubility change to the developer.

The photosensitive layer may include a polymer with one or more groups or chemical branches extending from (linked to) the polymer backbone chain. The polymer may include any number of carbons coupled in a carbon chain to form the backbone chain. In an embodiment, the groups or branches extending from a polymer of a photosensitive layer are approximately 50% or greater acid labile groups, such as ALG 400 described below with reference to FIG. 4. In an embodiment, the groups or branches extending from a polymer of a photosensitive material are approximately 55% ALG, such as ALG 400 described below with reference to FIG. 4. In an embodiment, the groups or branches extending from a polymer of a photosensitive material are approximately 60% ALG, such as ALG 400 described below with reference to FIG. 4. In an embodiment, the photosensitive layer 106 includes the polymer 700, described below with reference to FIG. 7.

The increase in the ALG may increase the contrast between exposed and non exposed regions of the photosensitive material. This can allow for optical contrast improvement. Additionally or alternatively, the higher ALG percentage in the photosensitive material allows for greater hydrophobicity and/or increase of the negative tone developer or non polar solvent developer dissolution rate of the material. The subsequent leaving of the ALG (e.g., as described below) provides for the polymer of the photosensitive material to have an increased hydrophilic-nature (e.g., as carboxylic acid remains upon the leaving of the ALG). Thus, the portions of the photosensitive material where the ALG leaves are more resistant to non polar solvent (e.g., negative tone developer solvent). Therefore, the contrast between soluble/non-soluble regions of the photosensitive material may be improved. Thus, in an embodiment, the ALG percentage provided in the polymer of the photosensitive material may provide for improved chemistry and improved developer contrast, for a negative tone developer.

The method 300 then proceeds to step 304 where the substrate is irradiated. The method may use various and/or varying wavelengths of radiation to expose the energy-sensitive photosensitive layer, described above with reference to step 302. Lithography processes include immersion lithography, photolithography, optical lithography and/or other patterning methods which may transfer a pattern onto the photosensitive layer. In an embodiment, the substrate is irradiated using ultraviolet (UV) radiation or extreme ultraviolet (EUV) radiation. The radiation beam may additionally or alternatively include other radiation beams such as ion beam, x-ray, extreme ultraviolet, deep ultraviolet, and other proper radiation energy. Exemplary radiation includes a 248 nm beam from a krypton fluoride (KrF) excimer laser, a 193 nm beam from an argon fluoride (ArF) excimer laser, and/or other suitable wavelength radiations. In an example, the photosensitive layer includes photo-acid generator (PAG) that generates acid during the exposure process thus changing the solubility of the exposed/non-exposed material.

The method 300 then proceeds to step 306 where a post-exposure bake (PEB) process is performed. During the baking process, the photosensitive layer is provided at an elevated temperature. This may allow more acid to be generated from the photo-generated acids through a chemical amplification process.

The method 300 then proceeds to step 308 where a treatment is performed on the exposed photosensitive layer. In embodiments of the method 300, step 308 is omitted. The treatment may be applied to assist the leaving of a lactone or a polarity switch group, such as described with reference to FIG. 6.

In an embodiment, the treatment is a liquid-phase treatment. For example, in an embodiment, the treatment is a liquid dilute base treatment. In an embodiment, treatment is a vapor-phase treatment. For example, in an embodiment, the treatment is a water solution or base water vapor treatment. The treatment may include introducing a chemical solution (it is noted that the term solution as used herein includes but is not limited to homogeneous mixtures) that has a pH value of greater than approximately 5. In an embodiment, the chemical solution has a pH value of approximately 8. In an embodiment, the treatment solution includes at least one of carboxylic acid water, base water liquid, base water vapor, $NH_3$ water, or dilute TMAH water.

In an embodiment, the treatment is provided after the PEB process, such as described above with reference to step 306. An additional baking process may be provided after the treatment. The additional baking process may provide to evaporate the treatment liquid or vapor.

The treatment may increase the hydrophobic nature of the photosensitive material, for example, in the non-exposed regions of the photosensitive layer. The treatment may increase the hydrophilic nature of the photosensitive material, for example, in the exposed regions of the photosensitive layer. For example, the region having been switched by the irradiation to be more ionic may have an increased hydrophilic property. The treatment may provide for the opening of a lactone unit(s) of the polymer of the photosensitive material (e.g. opening of the lactone allowing for increased hydrophilic properties). See the description of FIG. 8 below.

The method 300 then proceeds to step 310 where the exposed photosensitive layer is developed. The developing may form a patterned photosensitive layer. During the developing process, a developing solution is applied to the photosensitive layer. In one embodiment, the photosensitive material that was not exposed to the radiation of step 308 is removed by the developing solution. The developing solution may be a negative tone developer (e.g., suitable for developing negative tone photoresist). A negative tone developer indicates a developer that selectively dissolves and removes the non-irradiated regions of a photosensitive layer. The negative tone developer may include an organic solvent or other solvent now known or later developed. For example, the negative tone developer may include an organic solvent such as, MAK solvent (Eastman Chemicals) or n-butyl acetate or NBA.

The method 300 may proceed to rinsing, drying, and/or other suitable processes. The patterned photosensitive layer may be used as a masking element in performing one or more processes on underlying layers such as etching, ion implantation, deposition, and/or other suitable processes including those typical of a CMOS-compatible process.

Figure 4:
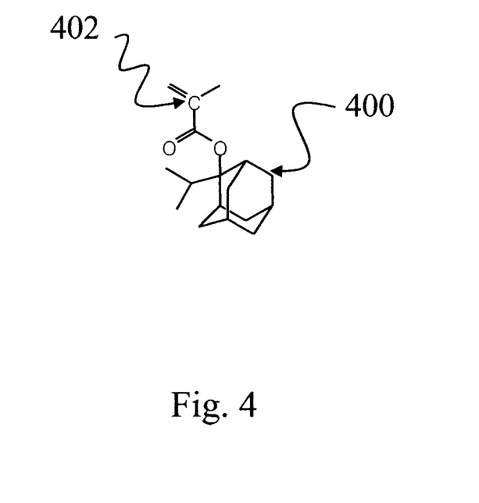
FIGS. 4, 5, and 6 are embodiments of units which may be attached to a resist polymer according to the present disclosure.
Figure 5:
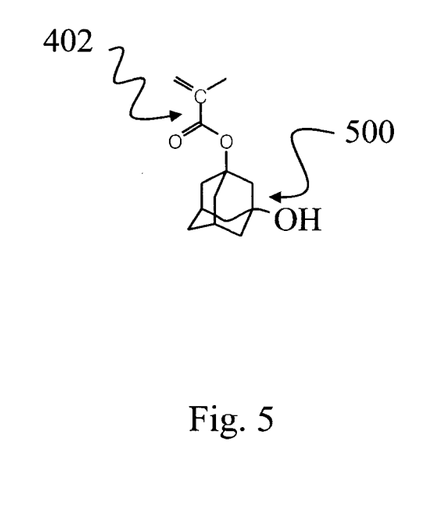
Figure 6:
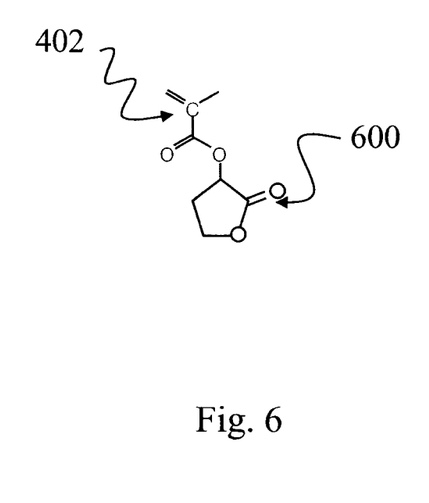

Referring now to FIGS. 4, 5, and 6 illustrated are various units (or groups or branches) which may be provided attached to (linked to) a polymer unit of a photosensitive material. FIGS. 4, 5, and 6 may illustrate the units or branches prior to exposure, bake, and/or development processes. FIG. 4 illustrates an acid labile group (ALG) 400. FIG. 5 illustrates an adhesion promoter unit 500. FIG. 6 illustrates a lactone unit 600. Each unit 400, 500, and 600 are attached to a monomer unit 402 of a polymer. The polymer consisting of the monomer units 402 may be substantially similar to the polymer 700 described below with reference to FIG. 7.

The ALG 400 may provide hydrophobic properties. After exposure to radiation, the ALG 400 may leave the polymer of the photosensitive material. This "leaving" may be assisted by the photo acid activated in the PEB step. The leaving of the ALG unit may make the polymer more hydrophilic in the region(s) exposed to irradiation than those region(s) of non-exposure. The lactone unit 600 may also provide hydrophilic properties. The adhesion promoter unit 500 may increase adhesion to an adjacent layer.

Figure 7:
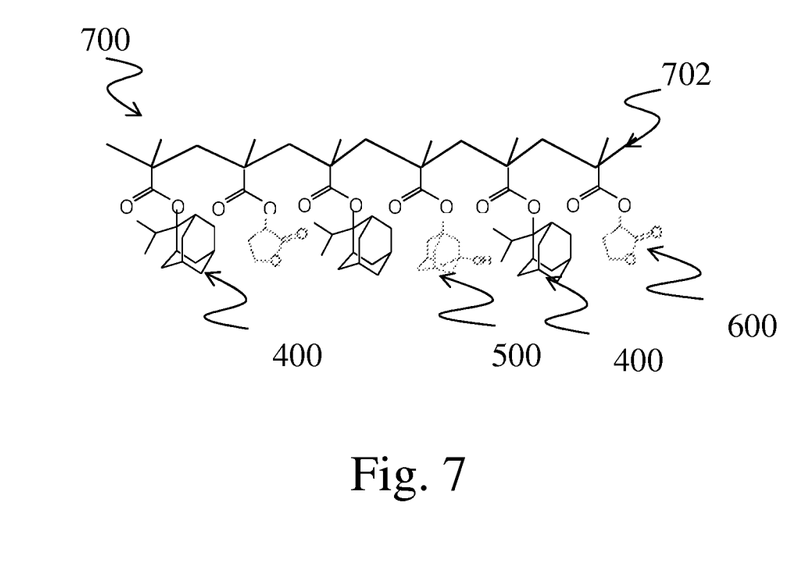
FIG. 7 is an embodiment of a resist polymer according to aspects of the present disclosure.

Referring now to FIG. 7, illustrated is a photosensitive material 700. The photosensitive material 700 may be used as the photosensitive layer 106, described above with reference to FIG. 1, and/or the photosensitive layer described above with reference to step 302 of the method 300, described in FIG. 3. The photosensitive material 700 includes branches or units linked to a polymer backbone 702 that include an ALG 400, an adhesion promoter group 500, and a lactone group 600, described above with reference to FIGS. 4, 5, and 6, respectively. The photosensitive material may be a negative tone photoresist.

In an embodiment, the photosensitive material 700 may include approximately 50% or greater ALG, such as ALG 400 linked to a polymer backbone chain 702. For example, of the units linked to the polymer, 50% or greater are ALG. In an embodiment, the photosensitive material 700 may include approximately 55% ALG, such as ALG 400 linked to the polymer backbone chain 702. In an embodiment, the photosensitive material 700 may include approximately 60% ALG, such as ALG 400 linked to the polymer backbone chain 702. In an embodiment, the photosensitive material 700 may include approximately 0-10% adhesion promoter, such as adhesion promoter 500, linked to the polymer backbone chain 702. In an embodiment, the photosensitive material 700 may include approximately 30% to approximately 70% lactone unit, such as lactone unit 600, linked to the polymer backbone chain 702.

Figure 8:
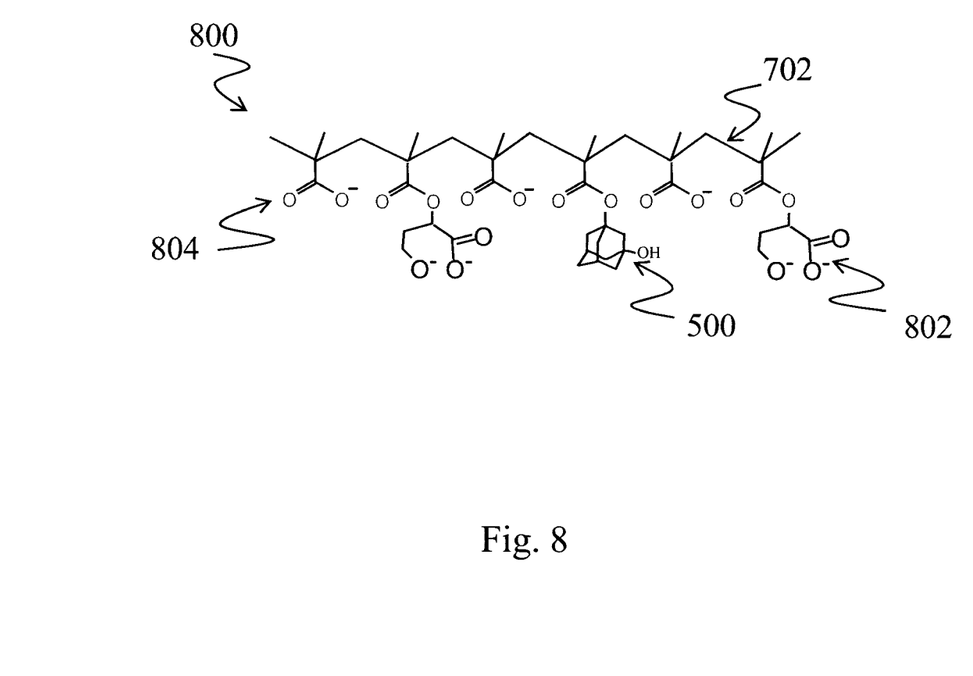
FIG. 8 is an embodiment of the resist polymer of FIG. 7 after development.

Referring now to FIG. 8, illustrates it the photosensitive material 800. The photosensitive material 800 provides the photosensitive material 700, illustrated in FIG. 7, after exposure (and/or PEB process). The photosensitive material 800 has a higher relative hydrophilic-nature as compared to the photosensitive material 700. Thus, the photosensitive material 700 of FIG. 7 has a higher dissolution rate in negative tone developer; the photosensitive material 800 of FIG. 8 (after exposure) has a lower dissolution rate in a negative tone developer.

As illustrated in FIG. 8, after exposure, the ALG 400 has left (or cleaved) from the polymer backbone chain 702 illustrated by carboxylic acid 804. The carboxylic acid 804 is highly hydrophilic in nature, thus increasing the hydrophilic-nature of the material 800. Thus, the branch 804 provides resistance to negative tone developer solution. The adhesion promoter 500 remains linked to the polymer backbone chain 702. The lactone group 600 has opened to font), hydrophilic branch 802 after contact to base liquid or chemical. Thus, the hydrophilic branch 802 also provides resistance to negative tone developer solution. In an embodiment, the photosensitive material 800 is illustrative of the exposed (or irradiated) portions of the photosensitive layer 106, described above with reference to FIG. 1 and the features 202, described above with reference to FIG. 2. In an embodiment, the photosensitive material 700, of FIG. 7, is illustrative of the non-irradiated portions of the photosensitive layer 106, described above with reference to FIG. 1.

In summary, the methods and devices disclosed herein provide materials and methods for photolithography processes. In doing so, embodiments of the present disclosure offer several advantages over prior art devices. Advantages of the present disclosure include improved contrast between the solubility of irradiated and non-irradiated regions of a negative tone (or type) photoresist to a negative tone developer. For example, additional contrast can be obtained by increasing the acid labile group concentration. As another example, additional contrast can be provided by increasing the polarity of the exposed resist by performing an additional treatment (e.g., vapor or liquid phase base). It is understood that different embodiments disclosed herein offer different disclosure, and that they may make various changes, substitutions and alterations herein without departing from the spirit and scope of the present disclosure.

Thus, in one embodiment described herein a pattern forming method is provided that includes applying a photosensitive material to a substrate. The photosensitive material is exposed to a radiation beam (e.g., patterned). The photosensitive material, after exposure or irradiation, is treated. Exemplary treatments include applying a base to the photosensitive material. For example, a liquid having a pH greater than approximately 3 or a vapor having a pH greater than approximately 3 may be applied. The photosensitive material is then developed. The development may include using a negative tone developer (solvent). The photosensitive material may be a negative tone resist, thus having a solubility that decreases in negative tone developer upon irradiation.

In an embodiment, the treatment is performed after a post-exposure bake (PEB) process. The treatment may provide for increased hydrophobicity of non-exposed regions of the photosensitive material. Thus increase the non polar solvent (e.g., negative tone developer) dissolution rate. An additional bake process (e.g., in addition to the soft back and PEB) may be applied after the treatment.

In an embodiment, the photosensitive material solubility in negative tone developer decreases upon irradiation and includes greater than 50% acid labile group (ALG) (see FIG. 7).

In another embodiment, a pattern forming method is described which includes applying a negative tone photosensitive material to a substrate (e.g., the photosensitive material is soluble in negative tone developer decreases upon irradiation). The photosensitive material includes greater than approximately 50% acid labile groups as its branch units. The photosensitive material is then exposed to a radiation beam and developed using negative tone developer.

In an embodiment, a treatment (e.g., introduction of a base) is performed on the photosensitive material that includes greater than 50% acid labile groups after PEB and prior to applying a negative tone developer.

In another embodiment, a photosensitive material is described. The photosensitive material may be a negative tone photoresist. The photosensitive material includes a polymer having a greater than 50% acid labile group units linked to a backbone chain; a photo-acid generator; and a solvent. The polymer may further include an adhesion promotion group linked to the backbone chain. The polymer may further include a lactone group linked to the backbone chain.

What is claimed is:

1. A pattern forming method, comprising:
applying a photosensitive material to a substrate, wherein the photosensitive material solubility in negative tone developer decreases upon irradiation and wherein the photosensitive material includes:
a polymer backbone chain wherein greater than approximately 50% of the groups linked to the polymer backbone chain are acid labile groups, wherein each of the acid labile groups have the structure:

the polymer backbone chain further comprising a plurality of lactone groups linked to the polymer backbone chain;
exposing the photosensitive material to a patterned radiation beam;
performing a post exposure bake (PEB) process after the exposing the photosensitive material;
after the PEB, treating the photosensitive material with a base chemical, wherein the treating causes an opening of each of the plurality of lactone units from the polymer backbone chain to form a respective hydrophilic branch linked to the polymer backbone after contact with the base chemical; and
after the treating, applying a developer for developing the photosensitive material, wherein a negative tone developer is applied to the photosensitive material having the opened plurality of lactone units.

2. The method of claim 1, wherein the treating provides the base chemical in a liquid form.

3. The method of claim 1, wherein the treating provides for decreased hydrophobicity of exposed regions of the photosensitive material.

4. The method of claim 1, wherein the base chemical has a pH value of approximately 8.

5. The method of claim 1, wherein the plurality of lactone groups each have the structure:

6. A pattern forming method, comprising:
applying a negative-tone photosensitive material to a substrate wherein the photosensitive material includes a polymer backbone chain having greater than approximately 50% of the groups linked to the polymer backbone chain being acid labile groups, wherein each of the acid labile groups have the structure:

and wherein the photosensitive material also has lactone groups linked to the polymer backbone chain;
selectively exposing the photosensitive material to a radiation beam;
baking the substrate having the exposed photosensitive material, wherein the baking is post-exposure bake process that generates acid through a chemical amplification process in the exposed photosensitive material, wherein the acid labile groups leave from the polymer backbone chain during the exposing or baking;
treating the exposed photosensitive material after the post-exposure bake process, wherein the treating includes applying a liquid base to the photosensitive material and the treating opens the lactone groups linked to the polymer backbone chain to provide hydrophilic branch linked to the polymer backbone chain; and
applying a negative tone developer to the photosensitive material after the treating of the photosensitive material, wherein the negative tone developer removes regions of the treated photosensitive layer not exposed to the radiation beam.

7. The pattern forming method of claim 6, wherein the photosensitive material solubility in a negative tone developer decreases upon irradiation.

8. The pattern forming method of claim 6, wherein the treating provides for decreased hydrophobicity of exposed regions of the photosensitive material.

9. The pattern forming method of claim 6, wherein the treating includes providing the liquid having a pH of approximately 8.

10. The pattern forming method of claim 6, performing a second bake process after the treating.

11. A method of lithography using a photosensitive material, comprising:

depositing the photosensitive material on a semiconductor substrate, wherein the photosensitive material includes:

a polymer having a backbone chain and wherein greater than 50% of the groups linked to the backbone chain are acid labile group units having the structure:

and wherein lactone groups are also linked to the backbone chain;

a photo-acid generator; and a solvent; and selectively exposing the deposited photosensitive material to radiation, after the selective exposure, performing a post-exposure bake (PEB) process on the deposited photosensitive material;

applying a chemical treatment on the photosensitive material including applying a base chemical including TMAH and water to the exposed photosensitive material after the PEB process, wherein the chemical treatment causes an opening of the lactone units on the backbone chain; and after the treatment, developing the photosensitive material to form a patterned photosensitive layer on the semiconductor substrate.

12. The method of claim 11, wherein the photosensitive material is a negative tone photoresist.

13. The method of claim 11, further comprising: performing a second bake process after applying the chemical treatment and before the developing.

* * * * *